United States Patent
Kato et al.

(10) Patent No.: US 11,013,112 B2
(45) Date of Patent: May 18, 2021

(54) CERAMIC COPPER CIRCUIT BOARD AND SEMICONDUCTOR DEVICE BASED ON THE SAME

(71) Applicants: Kabushiki Kaisha Toshiba, Tokyo (JP); Toshiba Materials Co., Ltd., Yokohama (JP)

(72) Inventors: Hiromasa Kato, Nagareyama Chiba (JP); Takashi Sano, Fujisawa Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 91 days.

(21) Appl. No.: 16/457,479

(22) Filed: Jun. 28, 2019

(65) Prior Publication Data

US 2019/0327831 A1 Oct. 24, 2019

Related U.S. Application Data (63) Continuation of application No. PCT/JP2018/011645, filed on Mar. 23, 2018.

(30) Foreign Application Priority Data

Mar. 30, 2017 (JP) .............................. JP2017-068153

(51) Int. Cl.
*H05K 7/00* (2006.01)
*H05K 1/03* (2006.01)
(Continued)

(52) U.S. Cl.
CPC ......... *H05K 1/0306* (2013.01); *C22C 1/0425* (2013.01); *C22C 9/02* (2013.01);
(Continued)

(58) Field of Classification Search
CPC ...... H05K 1/0306; H05K 1/092; H05K 1/115; H05K 1/181; C22C 1/0425; C22C 9/02;
(Continued)

(56) References Cited

U.S. PATENT DOCUMENTS

| 7,482,685 B2* | 1/2009 | Fukuda ................. H01L 23/053 257/703 |
| 2003/0011063 A1* | 1/2003 | Yamada .............. H01L 23/3128 257/698 |
| 2009/0101392 A1* | 4/2009 | Kaga .................... H05K 1/0271 174/252 |
| 2014/0110153 A1* | 4/2014 | Kashiwagi .............. C22C 30/02 174/251 |

(Continued)

FOREIGN PATENT DOCUMENTS

| EP | 2579696 A1 | 4/2013 |
| EP | 3031789 A1 | 6/2016 |

(Continued)

*Primary Examiner* — Yuriy Semenenko
(74) *Attorney, Agent, or Firm* — Harness, Dickey & Pierce, P.L.C.

(57) ABSTRACT

According to one embodiment, a ceramic copper circuit board a ceramic substrate, a copper circuit board provided at one surface of the ceramic substrate. A ratio of a thickness of the copper circuit board to a thickness of the ceramic substrate is 1.25 or more. A number of grain boundaries is not less than 5 and not more than 250 along every 10-mm straight line drawn in a front surface of the copper circuit board.

19 Claims, 3 Drawing Sheets

(51) Int. Cl.
*C22C 1/04* (2006.01)
*C22C 9/02* (2006.01)
*C22C 30/02* (2006.01)
*C22C 30/04* (2006.01)
*H01L 23/15* (2006.01)
*H05K 1/09* (2006.01)
*H05K 1/11* (2006.01)
*H05K 1/18* (2006.01)

(52) U.S. Cl.
CPC .............. *C22C 30/02* (2013.01); *C22C 30/04* (2013.01); *H01L 23/15* (2013.01); *H05K 1/092* (2013.01); *H05K 1/115* (2013.01); *H05K 1/181* (2013.01); *C04B 2235/96* (2013.01); *C04B 2237/407* (2013.01)

(58) Field of Classification Search
CPC ......... C22C 30/02; C22C 30/04; H01L 23/15; H01L 23/49827; H01L 23/3677; H01L 23/3735; H01L 23/49531; H01L 2224/48091; H01L 2224/48137; C04B 2235/96; C04B 2237/407; C04B 37/02
See application file for complete search history.

(56) References Cited

U.S. PATENT DOCUMENTS

| | | |
|---|---|---|
| 2014/0291699 A1 | 10/2014 | Yano et al. |
| 2015/0282379 A1* | 10/2015 | Terasaki .............. H01L 21/4882 361/720 |
| 2016/0163617 A1* | 6/2016 | Tani .................. H01L 23/49894 361/783 |
| 2017/0181272 A1* | 6/2017 | Aono .................... H05K 1/0306 |
| 2017/0208680 A1* | 7/2017 | Fukuchi ................... H05K 3/06 |
| 2017/0323842 A1* | 11/2017 | Tani ...................... C04B 35/645 |
| 2018/0190568 A1 | 7/2018 | Naba et al. |

FOREIGN PATENT DOCUMENTS

| | | |
|---|---|---|
| JP | H11121889 A | 4/1999 |
| JP | 2007/299974 A | 11/2007 |
| JP | 2011/119343 A | 6/2011 |
| JP | WO2013/094213 A1 | 6/2013 |
| JP | 2014/060407 A | 4/2014 |
| JP | WO2015/019602 A1 | 2/2015 |
| WO | WO-2013015355 A1 | 1/2013 |
| WO | WO-2017006661 A1 | 1/2017 |

\* cited by examiner

CERAMIC COPPER CIRCUIT BOARD AND SEMICONDUCTOR DEVICE BASED ON THE SAME

CROSS-REFERENCE TO RELATED APPLICATIONS

This is a continuation application of International Application PCT/JP2018/011645, filed on Mar. 23, 2018, which claims the benefit and priority of Japanese Patent Application No. 2017-068153, filed on Mar. 30, 2017. The entire contents of each of the above applications are incorporated herein by reference.

FIELD

Embodiments described herein relate generally to a ceramic copper circuit board and a semiconductor device based on the same.

BACKGROUND

A ceramic copper circuit board is used in a semiconductor device in which a semiconductor element such as a power element or the like is mounted. The ceramic substrate and the copper circuit board are bonded via a bonding layer. A Ag brazing material that includes a reactive metal such as Ti or the like is used as the bonding layer. The bonding strength and the heat cycle characteristics are improved thereby. Due to the increase of the reliability of ceramic copper circuit boards, ceramic copper circuit boards are used favorably in inverters of automobiles (also including electric cars), electric railway vehicles, solar power generation equipment, and industrial machinery.

In a semiconductor device such as a power module or the like, a semiconductor element is mounted on the copper circuit board. Also, wire bonding and/or a metal terminal may be bonded to the copper circuit board for the conduction of the semiconductor element. The semiconductor element, the wire bonding, the metal terminal, etc., are bonded to the copper circuit board to complete the semiconductor device.

International publication WO2013-094213 (Patent Literature 1) describes a ceramic copper circuit board in which the reliability is increased. In Patent Literature 1, the reliability is increased by optimizing the side surface configuration of the copper circuit board. The bonding strength and the heat cycle resistance of the ceramic copper circuit board of Patent Literature 1 are improved.

On the other hand, there is still room for improvement to increase the reliability of the assembly process in which the semiconductor element, the wire bonding, the metal terminal, etc., are bonded to the copper circuit board.

DETAILED DESCRIPTION

According to one embodiment, a ceramic copper circuit board a ceramic substrate, a copper circuit board provided at one surface of the ceramic substrate. A ratio of a thickness of the copper circuit board to a thickness of the ceramic substrate is 1.25 or more. A number of grain boundaries is not less than 5 and not more than 250 along every 10-mm straight line drawn in a front surface of the copper circuit board.

A ceramic copper circuit board according to an embodiment is a ceramic copper circuit board in which a copper circuit board is provided on at least one surface of a ceramic substrate; a ratio of a thickness of the copper circuit board to a thickness of the ceramic substrate is 1.25 or more; and a number of grain boundaries is not less than 5 and not more than 250 along every 10-mm straight line drawn in the copper circuit board front surface.

Figure 1:
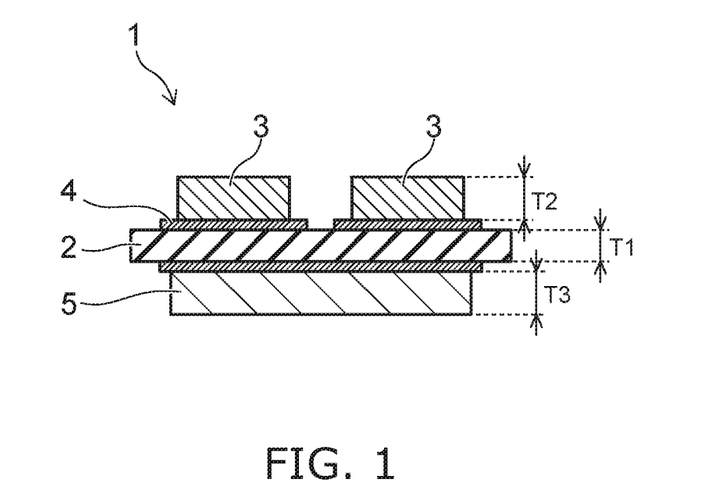
FIG. 1 is a view showing an example of a ceramic copper circuit board according to an embodiment.

FIG. 1 shows an example of the ceramic copper circuit board. 1 is the ceramic copper circuit board. 2 is the ceramic substrate. 3 is the copper circuit board (the front copper plate). 4 is a bonding layer. 5 is a back copper plate. T1 is the thickness of the ceramic substrate. T2 is the thickness of the copper circuit board. FIG. 1 shows an example in which two copper circuit boards 3 are bonded to the ceramic substrate 2. The embodiment is not limited to such a form; and one, three, or more copper circuit boards 3 may be bonded to the ceramic substrate 2. In the example of FIG. 1, a back copper plate 5 also is bonded to the ceramic substrate 2. The back copper plate 5 functions not as a circuit but as a heat dissipation plate. The back copper plate 5 can be provided as necessary.

The ratio (T2/T1) of the thickness T2 of the copper circuit board 3 to the thickness T1 of the ceramic substrate 2 is 1.25 or more. The thickness T2 of the copper circuit board 3 is taken as the thickest thickness of the copper plate within the copper plate used as the circuit board of the ceramic copper circuit board 1. Therefore, the thickness of the back copper plate 5 is not treated as T2.

T2/T1≥1.25 means that the copper circuit board 3 is thicker than the ceramic substrate 2. The thermal resistance of the ceramic copper circuit board 1 can be lowered by making the copper circuit board 3 thicker and making the ceramic substrate 2 thinner. Therefore, it is favorable for T2/T1 to be 1.25 or more. More favorably, T2/T1 is 2.40 or more.

It is favorable for the ceramic substrate 2 to be one type of an aluminum oxide substrate, an aluminum nitride substrate, or a silicon nitride substrate. Also, the ceramic substrate 2 may be an Alusil substrate. The Alusil substrate is made of a sintered body in which aluminum oxide and zirconium oxide are mixed.

The three-point bending strength of an aluminum nitride substrate or an aluminum oxide substrate is about 300 to 450 MPa. The strength of an Alusil substrate is about 550 MPa. If the substrate thickness of a ceramic substrate having a strength of 550 MPa or less is reduced to be 0.4 mm or less, there is a risk that the ceramic substrate may break when performing a heat cycle test (TCT test).

The three-point bending strength of a silicon nitride substrate is, for example, 600 MPa or more. Also, the strength can be increased so that the three-point bending strength is 700 MPa or more. The thermal conductivity of the silicon nitride substrate is, for example, 50 W/m·K or more. Also, the thermal conductivity can be 80 W/m·K or more. In particular, in recent years, there is a silicon nitride substrate that has both a high strength and a high thermal conductivity. If the three-point bending strength of the silicon nitride substrate is 600 MPa or more and the thermal conductivity is 80 W/m·K or more, the thickness of the substrate can be set to, for example, 0.40 mm or less. It is also possible to set the thickness to be thinner, i.e., 0.30 mm or less. By making the ceramic substrate thinner, T2/T1 can be 1.25 or more, or even 2.40 or more.

Also, the ceramic substrate may be a single plate or may have a three-dimensional structure such as a multilayer structure, etc.

Figure 2:
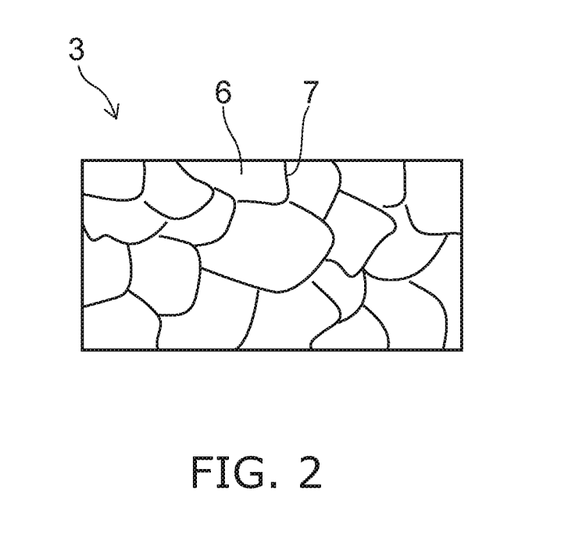
FIG. 2 is a view showing an example of a front surface of the copper circuit board.

The number of grain boundaries is not less than 5 and not more than 250 along every 10-mm straight line drawn in the copper circuit board front surface. FIG. 2 shows an example of the copper plate front surface. In FIG. 2, 3 is the copper circuit board. 6 is the copper crystal grains. 7 is the grain boundaries. The copper circuit board is made of a polycrystalline body of copper. An enlarged photograph is taken of the copper circuit board front surface. The enlarged photograph is enlarged enough that the grain boundaries can be confirmed. If a 10-mm straight line cannot be imaged in one field of view, imaging is performed by subdividing into a plurality. In the case where the copper circuit board is patterned into a pattern configuration, a portion that has a length of 10 mm or more in some direction is imaged.

In the embodiment, for every 10-mm straight line drawn in the enlarged photograph, the number of grain boundaries along the straight line is not less than 5 and not more than 250.

The semiconductor element, the wire bonding, the metal terminal, etc., are bonded to the copper circuit board 3. At this time, these components are bonded to each other via a bonding layer such as solder, etc. When there are grain boundaries in the front surface of the copper circuit board 3, an anchor effect for the bonding layer is obtained. The wettability with the bonding layer also is improved. If the number of grain boundaries in the 10-mm straight line is less than 5, the number of grain boundaries is low and insufficient. If the number of grain boundaries is low, the copper crystal grains are large; and the contact ratio between the bonding layer and the copper crystal grain surface is high. If the junction temperature of the semiconductor element becomes high, the thermal expansion of the copper plate becomes large. If the grain boundaries are few, peeling between the copper circuit board front surface and the bonding layer occurs easily because the anchor effect is insufficient. When the number of grain boundaries in the 10-mm straight line exceeds 250, the number of grain boundaries is too high. If the number of grain boundaries increases, the anchor effect is obtained; but the grain boundaries become too many; and the heat dissipation decreases. Therefore, along every 10-mm straight line, it is favorable for the number of grain boundaries to be not less than 5 and not more than 250, and more favorably not less than 20 and not more than 150. More favorably, the number of grain boundaries along every 10-mm straight line is not less than 80 and not more than 150. Because the number of grain boundaries is within the range recited above no matter where the 10-mm straight line is drawn in the copper circuit board 3 front surface, excellent reliability can be obtained no matter where the semiconductor element, etc., are bonded on the copper circuit board 3. In other words, the circuit board provides excellent ease of assembly of the semiconductor device.

The number of grain boundaries may be adjusted by adjusting the crystal size in a rolling process that adjusts the thickness of the copper plate. The number of grain boundaries may be adjusted by utilizing a heat treatment process of the manufacturing processes of the ceramic copper circuit board. The recrystallization temperature of copper is about 220° C. As described below, for example, the ceramic substrate and the copper plate are bonded using reactive metal bonding. In reactive metal bonding, the ceramic substrate and the copper plate are heated to 700 to 900° C. The copper plate recrystallizes in this process. The recrystallized copper crystal grains become large. The number of grain boundaries also can be adjusted by utilizing this phenomenon.

At the copper circuit board front surface, it is favorable for the arithmetic average roughness Ra to be 0.4 µm or less, the ten-point average roughness Rzjis to be 4 µm or less, and the maximum height Rz to be 5 µm or less. Ra, Rzjis, and Rz which are the parameters of the surface roughness are based on the JIS-B-0601 (2001) standard.

JIS-B-0601 (2001) corresponds to ISO 4287 (1997, Amd. 1: 2009). Ra, Rzjis, and Rz may be measured using ISO 4287. JIS is given priority for the portions different between JIS-B-0601 and ISO 4287.

The arithmetic average roughness Ra is the average value of the roughness curve. The maximum height Rz is the maximum value in the vertical direction between the peak line and the course line of the roughness curve. The ten-point average roughness Rzjis is the total of the average value of the five highest hill peak portions and the average value of the five lowest dale bottom portions of the roughness curve.

A copper circuit board front surface that has a small surface unevenness is obtained by setting Ra, Rzjis, and Rz respectively to the values described above. Considering the anchor effect of the copper circuit board to the bonding layer of solder or the like, it is considered that a rough front surface is good. On the other hand, if the thickness of the copper circuit board becomes large and the junction temperature of the semiconductor element becomes high, the thermal expansion of the copper circuit board becomes large. If the thermal expansion of the copper circuit board becomes large, stress is applied to the bonding layer more easily as the surface unevenness increases; and discrepancies such as breaking, etc., occur easily.

Therefore, it is favorable for the arithmetic average roughness Ra of the copper circuit board front surface to be 0.4 µm or less, the ten-point average roughness Rzjis to be 4 µm or less, and the maximum height Rz to be 5 µm or less. Even if the surface unevenness is reduced, the reliability of the copper circuit board can be increased by controlling the number of grain boundaries.

It is favorable for the arithmetic average roughness Ra of the copper circuit board front surface to be not less than 0.1 µm and not more than 0.4 µm. It is favorable for the ten-point average roughness Rzjis of the copper circuit board front surface to be not less than 1.5 µm and not more than 4 µm. It is favorable for the copper circuit board front surface maximum height Rz to be not less than 1 µm and not more than 5 µm. There is a risk that planarizing the front surface further than this may cause an increase of the manufacturing cost.

It is favorable for the skewness Rsk of the roughness curve of the copper circuit board front surface to be less than 0. Rsk being less than 0 means that Rsk is negative. Rsk being negative means that there are more dale portions in the roughness curve. The grain boundary portions of the copper circuit board are dales. By causing the grain boundary portions to be dale portions, the anchor effect of the copper circuit board to the solder (or the brazing material) when bonding the semiconductor element can be improved. Therefore, it is favorable for the skewness Rsk of the roughness curve of the copper circuit board front surface to be less than 0. More favorably, the skewness Rsk of the roughness curve is not more than −0.01 and not less than −0.10. By setting the skewness Rsk to be within this range, the anchor effect can be improved also for bonding of a leadframe and/or wire bonding other than the semiconductor element.

The skewness Rsk of the roughness curve is measured using ISO 4287 (1997, Amd. 1: 2009).

In the case where the back copper plate 5 is provided, it is favorable for the back copper plate 5 to have the following configuration.

The ratio (T3/T1) of a thickness T3 of the back copper plate 5 to the thickness T1 of the ceramic substrate 2 is 1.25 or more. More favorably, T3/T1 is 2.40 or more.

The number of grain boundaries is not less than 5 and not more than 250 along every 10-mm straight line drawn in the back copper plate front surface. Favorably, the number of grain boundaries is not less than 20 and not more than 150. More favorably, the number of grain boundaries is not less than 80 and not more than 150. The technique for counting the number of grain boundaries is similar to the technique for counting the number of grain boundaries for the front surface of the copper circuit board. The front surface of the back copper plate refers to the surface of the back copper plate 5 on the side opposite to the ceramic substrate 2.

In the back copper plate front surface, it is favorable for the arithmetic average roughness Ra to be 0.4 μm or less, the ten-point average roughness Rzjis to be 4 μm or less, and the maximum height Rz to be 5 μm or less. It is favorable for the arithmetic average roughness Ra of the back copper plate front surface to be not less than 0.1 μm and not more than 0.4 μm. It is favorable for the ten-point average roughness Rzjis of the back copper plate front surface to be not less than 1.5 μm and not more than 4 μm. It is favorable for the back copper plate front surface maximum height Rz to be not less than 1 μm and not more than 5 μm. It is favorable for the skewness Rsk of the roughness curve of the back copper plate front surface to be less than 0. More favorably, the skewness Rsk of the roughness curve is not more than −0.01 and not less than −0.10.

It is favorable for the ceramic substrate 2 and the copper circuit board 3 to be bonded via the bonding layer 4. In the case where the back copper plate 5 is bonded to the ceramic substrate 2 as well, it is favorable for the back copper plate 5 and the ceramic substrate 2 to be bonded via the bonding layer. It is favorable to provide the bonding layer 4 that includes Ag and Ti between the ceramic substrate 2 and the copper circuit board 3. The bonding layer 4 that includes Ag (silver) and Ti (titanium) includes a reactive metal brazing material. Ti is the reactive metal. Other than Ti, Zr and Hf also are examples of the reactive metal. A mixture of Ti, Ag (silver), and Cu (copper) is an example of the reactive metal brazing material. In the reactive metal brazing material, the content of Ti is not less than 0.1 wt % and not more than 10 wt %; the content of Cu is not less than 10 wt % and not more than 60 wt %; and the remainder is Ag. Not less than 1 wt % and not more than 15 wt % of one type or two types selected from In (indium) or Sn (tin) may be added to the reactive metal brazing material as necessary. In the reactive metal bonding using the reactive metal brazing material, the reactive metal brazing material paste is coated onto the ceramic substrate front surface; and the copper plate is disposed on the reactive metal brazing material paste. This configuration is bonded by heating at 700 to 900° C. According to the reactive metal bonding, the bonding strength between the ceramic substrate and the copper circuit board can be not less than 16 kN/m.

It is favorable for the thickness of the copper circuit board to be 0.6 mm or more. As described above, it is effective to make the ceramic substrate thinner or make the copper circuit board thicker to set the ratio (T2/T1) of the thickness T2 of the copper circuit board and the thickness T1 of the ceramic substrate to be 1.25 or more. The heat dissipation is improved by increasing the thickness of the copper circuit board. As described above, the occurrence of the bonding defects between the semiconductor element and the copper circuit board due to thermal expansion can be reduced by controlling the surface roughness of the copper circuit board. Considering the heat dissipation, it is favorable for the thickness of the copper circuit board to be 0.6 mm or more. More favorably, the thickness of the copper circuit board is 0.8 mm or more. Although the upper limit of the thickness of the copper circuit board is not particularly limited, it is favorable for the upper limit to be 5 mm or less. When the thickness of the copper circuit board exceeds 5 mm, there is a risk that the warp may increase when bonding by reactive metal bonding.

Figure 5:
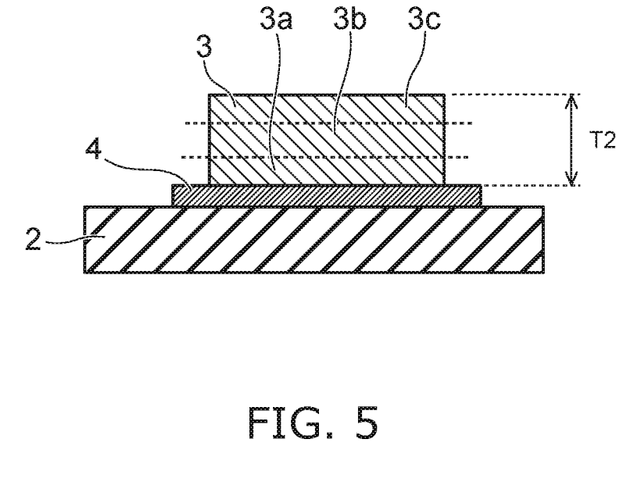
FIG. 5 is a view showing other example of the ceramic copper circuit board according to the embodiment.

When the copper circuit board is uniformly trisected in the thickness direction, it is favorable for Ag to exist in not less than 15% and not more than 60% of the surface area of the copper circuit board in the region of the copper circuit board on the bonding layer side. FIG. 5 shows an example of the cross section of the copper circuit board. In FIG. 5, 2 is the ceramic substrate. 3 is the copper circuit board. 4 is the bonding layer. T2 is the thickness of the copper circuit board 3. The copper circuit board 3 is uniformly trisected in the thickness direction. This is the uniform trisection of the thickness T2 of the copper circuit board 3. When the copper circuit board 3 is uniformly trisected, the region on the bonding layer 4 side is taken as a region 3*a*; the region in the middle is taken as a region 3*b*; and the region on the front surface side is taken as a region 3*c*.

Color mapping of the dispersion state of Ag in any cross section of the copper circuit board 3 is performed by EDX (energy dispersive X-ray spectrometry). For the cross section of the region 3*a*, when a randomly extracted unit area of 100 μm×100 μm is observed, the proportion of the surface area where Ag is dispersed per unit area is not less than 15% and not more than 60%. The cross section to be observed is polished so that the surface roughness Ra is 1 μm or less. SEM (scanning electron microscope)-EDX is used for the observation.

The boundary between the copper circuit board 3 and the bonding layer 4 can be discriminated in the SEM image. When it is difficult to discriminate using the SEM image, a straight line is drawn from one end of the surface of the copper circuit board 3 on the bonding layer 4 side to the other end of the surface on the opposite side. A method may be used in which the straight line is considered to be the boundary between the copper circuit board 3 and the bonding layer 4. For example, for a configuration in which the bonding layer 4 juts from the end portion of the copper circuit board 3 as shown in FIG. 1, the method in which the straight line is drawn is applied easily.

The stress of the copper plate becomes large when the thickness T2 of the copper circuit board is 0.6 mm or more or even 0.8 mm or more. When thermal stress is applied, breaking occurs easily in the ceramic substrate and the bonding layer due to the thermal expansion difference between the ceramic substrate and the copper plate. By diffusing much Ag, the thermal expansion amount of the copper circuit board can approach the thermal expansion amount of the ceramic substrate. The Ag diffuses mainly along the grain boundaries. The Ag easily diffuses to the depthward side of the copper plate by diffusing along the grain boundaries. In the embodiment, the ease of the Ag diffusion can be controlled because the number of grain boundaries of the copper circuit board is controlled.

When a unit area of 100 μm×100 μm of the region 3a is observed, it is favorable for the proportion of the surface area where Ag is dispersed to the observed surface area to be not less than 15% and not more than 60%. More favorably, the proportion is not less than 25% and not more than 50%. In the embodiment, the proportion of the surface area where Ag is dispersed to the observed surface area is not less than 15% and not more than 60% no matter which unit area of 100 μm×100 μm of the region 3a is observed.

When a unit area of 100 μm×100 μm of the region 3b is observed, it is favorable for the proportion of the surface area where Ag is dispersed to the observed surface area to be not less than 0% and not more than 40%. The proportion being 0% means that Ag is not detected by EDX. Also, the dispersion area of Ag in the region 3b is less than the Ag dispersion area in the region 3a.

When a unit area of 100 μm×100 μm of the region 3c is observed, it is favorable for the proportion of the surface area where Ag is dispersed to the observed surface area to be 0. It is favorable for the proportion of Ag inside the region 3b to be set to 40% or less (including 0%) and for the proportion of Ag inside the region 3c to be set to 0%.

By not diffusing Ag in the region 3a which is the front-surface-side region of the copper circuit board 3, the surface roughness and the number of grain boundaries of the copper circuit board front surface are controlled easily. Therefore, the adhesion between the semiconductor element and the solder (or the brazing material) can be maintained when mounting the semiconductor element. That is, the durability for thermal stress and the adhesion with the solder both can be realized.

It is favorable for the diffusion state of Ag into the back copper plate 5 or a back copper circuit board 8 also to be similar to that of the copper circuit board 3.

In other words, when the back copper plate 5 is uniformly trisected, the region on the bonding layer 4 side is taken as a first region; the region in the middle is taken as a second region; and the region on the front surface side is taken as a third region. The unit area of 100 μm×100 μm of each region is observed. In the first region, it is favorable for the proportion of the surface area where Ag is dispersed to the observed surface area to be not less than 15% and not more than 60%. More favorably, the proportion is not less than 25% and not more than 50%. In the second region, it is favorable for the proportion of the surface area where Ag is dispersed to the observed surface area to be not less than 0% and not more than 40%. In the third region, it is favorable for the proportion of the surface area where Ag is dispersed to the observed surface area to be 0%.

In the ceramic copper circuit board 1, it is favorable for the warp amount of the ceramic substrate 2 to be less than 0.1 mm. The warp amount of the ceramic substrate 2 is measured by the following method. A virtual straight line is drawn from one end to the other end of a long side of the ceramic substrate 2. The distance between the straight line and the point of the ceramic substrate 2 most distal to the straight line is taken as the warp amount. As described above, the warp amount of the ceramic substrate 2 can be less than 0.1 mm by controlling the diffusion state of Ag.

In particular, even in the case where a copper plate having a thickness of 0.6 mm or more is bonded using a silicon nitride substrate having a three-point bending strength of 600 MPa or more, the warp amount of the silicon nitride substrate can be less than 0.1 mm without a warp correction process. The warp correction process is a process of heating while loading the ceramic copper circuit board with pressure. The warp easily becomes large when bonding when the copper plate is made thicker and the strength of the ceramic substrate is low. The warp amount of the ceramic substrate can be reduced by performing the warp correction process. On the other hand, grain growth of the crystal grains of the copper plate occurs due to the heat loading of the warp correction process. When grain growth occurs, there is a risk that the number of grain boundaries per 10 mm of the copper plate front surface may be less than 5. If the warp correction process is not performed, the number of grain boundaries per 10 mm of the copper plate front surface is controlled easily to be 80 or more.

By setting the number of grain boundaries per 10 mm of the copper plate front surface to be not less than 80 and not more than 150, the warp amount of the silicon nitride substrate can be less than 0.1 mm even when the volume ratio of the copper plate is different between the front and back. The total volume of the copper circuit board 3 is taken as A (mm3); and the total volume of the back copper plate 5 is taken as B (mm3). The warp amount of the silicon nitride substrate can be less than 0.1 mm even within the range of 0.5≤A/B≤0.8. The total volume A (mm3) of the copper circuit board 3 is the total of the volume of each of one of more copper circuit boards 3 bonded to the front surface side. The total volume B (mm3) of the back copper plate 5 is the total of the volume of each of one or more back copper plates 5 bonded to the backside. As described below, in the case where one or more back copper circuit boards are bonded to the ceramic substrate 2, the total of the volume of each of the back copper circuit boards is taken as the total volume B (mm3).

For a ceramic copper circuit board in which a silicon nitride substrate having a three-point bending strength of 600 MPa or more and a copper plate having a thickness of 0.6 mm or more are bonded, it is favorable to control the number of grain boundaries per 10 mm of the copper plate front surface to be not less than 80 and not more than 150 and to control the diffusion state of Ag. Thereby, the warp amount of the silicon nitride substrate can be less than 0.1 mm, and further can be 0.05 mm or less without the warp correction process even for the range of 0.5≤A/B≤0.8.

Figure 3:
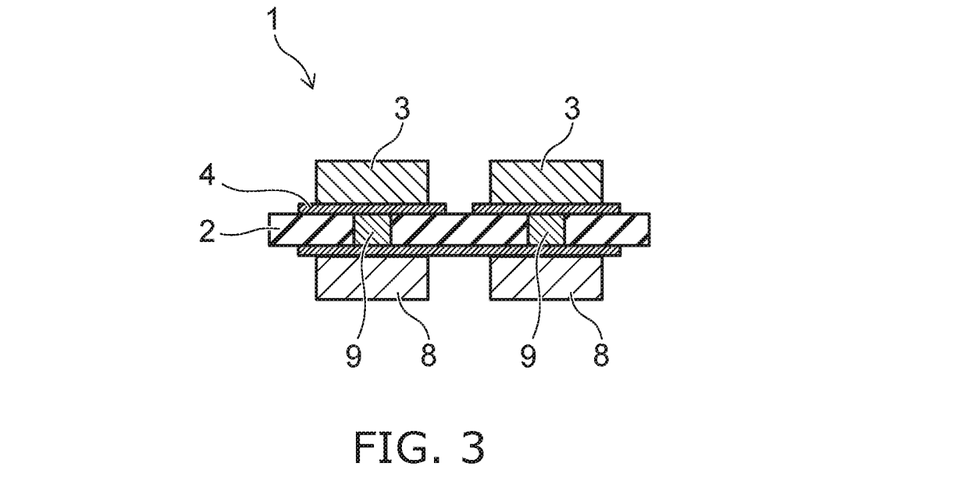
FIG. 3 is a view showing another example of the ceramic copper circuit board according to the embodiment.

A through-hole may be provided in the ceramic substrate. It is favorable for the ceramic copper circuit board to have a structure in which the copper circuit board of the front and the copper circuit board of the back conduct via the through-hole. An example of a ceramic circuit board having a through-hole is shown in FIG. 3. FIG. 3 is a cross-sectional view of the portion having the through-hole. In FIG. 3, 1 is the ceramic copper circuit board. 2 is the ceramic substrate. 3 is the copper circuit board (the front copper plate). 4 is the bonding layer. 8 is the back copper circuit board. 9 is the through-hole. In FIG. 3, the conduction between the copper circuit board 3 (the front copper plate) and the back copper circuit board 8 is realized via the through-hole 9. In FIG. 3, the through-hole 9 is provided at each copper circuit board 3. The embodiment is not limited to such a structure. In the ceramic copper circuit board 1, the through-hole 9 may be provided at only a portion of the multiple copper circuit boards 3. The thickness T2 of the copper circuit board is taken as the thicker of the thickness of the copper circuit board 3 and the thickness of the back copper circuit board 8.

It is favorable for the same material as the bonding layer 4 to be filled into the interior of the through-hole 9. The structure of the interior of the through-hole 9 is not particularly limited as long as conduction is provided between the copper plate of the front and the copper plate of the back.

Therefore, a metal thin film may be provided at only the through-hole 9 inner wall. On the other hand, the bonding strength can be increased by filling the same material as the bonding layer 4. It is favorable for the back copper circuit board 8 to have a configuration similar to the back copper plate 5 described above.

A metal thin film may be provided at the copper circuit board front surface. The major component of the metal thin film is one selected from Ni (nickel), Ag (silver), and Au (gold). The metal thin film is, for example, a plating film, a sputtered film, etc. By providing the metal thin film, the corrosion resistance can be improved.

Such a ceramic copper circuit board is favorable in a semiconductor device. In the semiconductor device, a semiconductor element is mounted to the copper circuit board of the ceramic copper circuit board via the bonding layer.

Figure 4:
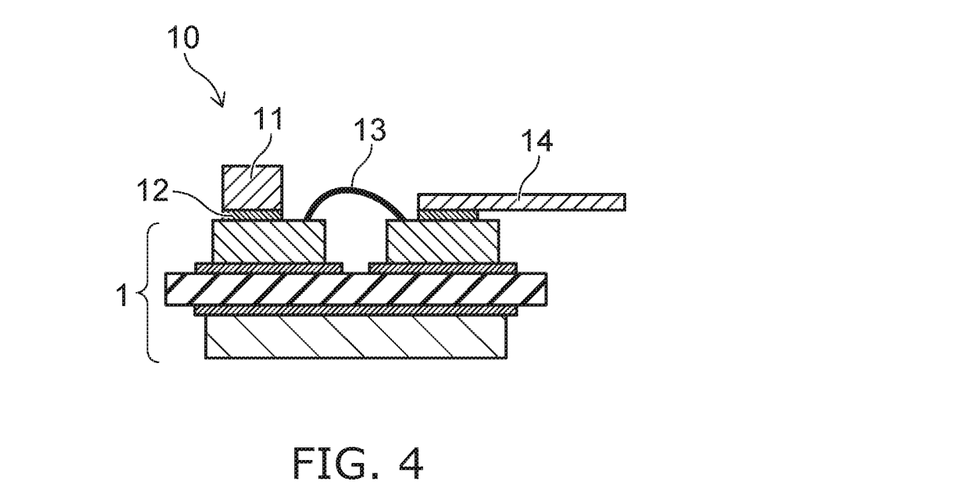
FIG. 4 is a view showing an example of a semiconductor device according to the embodiment.

An example of the semiconductor device is shown in FIG. 4. In FIG. 4, 1 is the ceramic copper circuit board. 10 is the semiconductor device. 11 is the semiconductor element. 12 is the bonding layer. 13 is wire bonding. 14 is a metal terminal. In FIG. 4, the semiconductor element 11 is bonded onto the copper circuit board of the ceramic copper circuit board 1 via the bonding layer 12. Similarly, the metal terminal 14 is bonded via the bonding layer 12. The mutually-adjacent copper circuit boards conduct via the wire bonding 13. Other than the semiconductor element 11 in FIG. 4, the wire bonding 13 and the metal terminal 14 are bonded. The semiconductor device according to the embodiment is not limited to such a structure. For example, only one of the wire bonding 13 or the metal terminal 14 may be provided. The semiconductor element 11, the wire bonding 13, and the metal terminal 14 each may be multiply provided at the copper circuit board 3. The semiconductor element 11, the wire bonding 13, and the metal terminal 14 are bonded to the back copper circuit board 8 as necessary. Various configurations such as a leadframe configuration, a protruding configuration, etc., are applicable to the metal terminal 14.

Solder, a brazing material, etc., are examples of the bonding layer 12 bonding the semiconductor element 11 or the metal terminal 14. Lead-free solder is favorable as the solder. It is favorable for the melting point of the solder to be 450° C. or less. It is favorable for the melting point of the brazing material to be 450° C. or less. A brazing material of which the melting point is 500° C. or more is called a high-temperature brazing material. An example of the high-temperature brazing material has Ag as a major component.

In the ceramic copper circuit board according to the embodiment, the heat dissipation is excellent because T2/T1 is 1.25 or more. The reliability of the bonding layer bonding the semiconductor element, etc., can be increased because the number of grain boundaries of the copper circuit board front surface is controlled. In particular, the reliability of the bonding between the semiconductor element and the copper circuit board can be maintained even when the junction temperature of the semiconductor element is a high temperature of 170° C. or more. The number of grain boundaries along every 10-mm straight line drawn in the copper circuit board front surface is controlled to be within the prescribed range. Therefore, high reliability can be obtained no matter where the semiconductor element, the wire bonding, or a metal terminal are bonded to the copper circuit board front surface. A semiconductor device that has good ease of assembly can be provided by increasing the reliability of the bonding of the semiconductor element, the wire bonding, and the metal terminal.

The placement positions of the semiconductor element, etc., on the copper circuit board are detected by image analysis using a CCD camera, etc. As the copper plate is made thicker, it becomes difficult to perform position detection referenced to the ceramic substrate. Therefore, by setting the number of grain boundaries of the copper circuit board front surface to be within the prescribed range beforehand, the position detection of the copper plate front surface is performed easily. In other words, according to the embodiment, a ceramic copper circuit board that has good ease of assembly can be provided.

In recent years, the higher performance and downsizing of semiconductor elements are advancing; and the heat generation amount from the chip is increasing. Therefore, the improvement of the heat dissipation is important for a ceramic copper circuit board in which the semiconductor element is mounted. For higher performance of the semiconductor device (the semiconductor module), it is favorable for multiple semiconductor elements to be mounted on the ceramic copper circuit board. When one of the semiconductor elements exceeds the intrinsic temperature, the resistance becomes negative; and the temperature coefficient changes to the negative side. Accordingly, thermal runaway occurs in which the electrical power flows concentratively in the one semiconductor element; and a phenomenon occurs in which breakdown of the one semiconductor element undesirably occurs instantaneously. Thereby, it is extremely effective to increase the reliability of the bonding between the semiconductor element and the copper circuit board. The semiconductor device according to the embodiment can be used as a PCU, IGBT, or IPM module. The PCU, IGBT, or IPM module is used in an inverter of a device of an automobile (also including an electric car), an electric railway vehicle, industrial machinery, an air conditioner, etc. Research to make electric cars for automobiles is being performed aggressively. The safety of the automobile also improves as the reliability of the semiconductor device increases. This is similar for an electric railway, industrial devices, etc., as well.

A method for manufacturing the ceramic copper circuit board according to the embodiment will now be described. As long as the ceramic copper circuit board has the configuration described above, the manufacturing method is not particularly limited. The following is an example of a method for manufacturing having good yield.

First, the ceramic substrate and the copper plate are prepared. The relationship between the thickness T1 of the ceramic substrate and the thickness T2 of the copper plate is T2/T1≥1.25.

It is favorable for the ceramic substrate to be one type selected from an aluminum oxide substrate, an aluminum nitride substrate, a silicon nitride substrate, and an Alusil substrate. In particular, it is favorable for the ceramic substrate to be a silicon nitride substrate having a thermal conductivity of 50 W/m·K or more and a three-point bending strength of 600 MPa or more. For such a silicon nitride substrate, the substrate thickness can be set to 0.40 mm or less. A copper plate that has a thickness of 0.6 mm or more is used.

In the case where the copper plate on the front side and the copper plate on the backside conduct via a through-hole, a ceramic substrate that has the through-hole is prepared. In the case where the through-hole is provided in the ceramic substrate, the through-hole may be provided beforehand in the molded body stage. A process of providing the through-hole in the ceramic substrate (the ceramic sintered body) may be performed. Laser processing, machining, etc., are examples of the process of providing the through-hole. Boring such as drilling, etc., are examples of the machining.

It is favorable for the number of grain boundaries to be not less than 10 and not more than 300 along every 10-mm straight line in the front surface of the copper plate. More favorably, the number of grain boundaries is not less than 50 and not more than 120 along every 10-mm straight line in the front surface of the copper plate. In the case where reactive metal bonding is performed for the bonding between the ceramic substrate and the copper plate, the bonding temperature is about 700 to 900° C. When the copper plate is exposed to this temperature, the copper recrystallizes. Thereby, the crystal grains become large; and the number of grain boundaries decreases. It is favorable to use a copper plate in which the number of grain boundaries is within the prescribed range described above while taking into account such a decrease.

It is favorable for the ceramic substrate and the copper plate to be bonded by reactive metal bonding. A reactive metal brazing material in which Ag and a reactive metal such as Ti or the like are mixed is used in the reactive metal bonding. A mixture of Ti, Ag (silver), and Cu (copper) is an example of the reactive metal brazing material. In the reactive metal brazing material, the content of Ti is not less than 0.1 wt % and not more than 10 wt %. The content of Cu is not less than 10 wt % and not more than 60 wt %. The remainder is Ag. Not less than 1 wt % and not more than 15 wt % of one type or two types selected from In (indium) or Sn (tin) may be added to the reactive metal brazing material as necessary.

The reactive metal brazing material is formed as a paste. The paste is obtained by mixing a brazing material component and an organic substance. The reactive metal brazing material paste is coated onto the ceramic substrate. The copper plate is disposed on the reactive metal brazing material paste. Then, the ceramic substrate and the copper plate are bonded by heating at 700 to 900° C. The heating process is performed in a vacuum or in a nonoxidizing atmosphere as necessary. When performing in a vacuum, it is favorable for the pressure to be $1 \times 10^{-2}$ Pa or less. A nitrogen atmosphere or an argon atmosphere is an example of the nonoxidizing atmosphere. The oxidization of the bonding layer can be suppressed by using a vacuum or a nonoxidizing atmosphere. The bonding strength can be increased thereby. The number of grain boundaries in the copper plate front surface can be adjusted by adjusting the bonding temperature and/or time.

By controlling the number of grain boundaries in the copper plate beforehand, Ag diffuses along the grain boundaries. To control the diffusion state of Ag, it is favorable for the thermal bonding process to include a degreasing process of the reactive metal brazing material paste. In the thermal bonding process, a temperature range of 700 to 900° C. is maintained for the bonding. Before reaching this temperature, the organic substance inside the paste is degreased. The diffusion amount of Ag can be controlled thereby. This is because the brazing material that contacts the copper plate can be homogenized by degreasing the organic substance inside the brazing material paste at the bonding temperature beforehand.

In the degreasing process of the brazing material paste, the temperature is maintained in a range of 250 to 450° C. It is favorable for the time of maintaining this temperature range to be in a range of 5 to 60 minutes. As another method, it is also effective to set the temperature increase rate to be 10° C./minute or less.

The copper plate that is bonded may be pre-patterned in a pattern configuration or may not be patterned. In the case where a copper plate that is not patterned is used, the copper plate may be patterned into a pattern configuration by etching after bonding. When performing the etching, it is favorable to provide a side surface configuration of the copper plate shown in Patent Literature 1 and a jutting portion of the brazing material shown in Patent Literature 1.

The ceramic copper circuit board is manufactured by the processes recited above. It is effective to perform chemical polishing to adjust the surface roughness of the copper circuit board of the ceramic copper circuit board that is obtained. An acidic liquid or an alkaline liquid is used in the chemical polishing. According to the chemical polishing, the copper circuit board front surface can be polished uniformly. Therefore, it is easy to control the arithmetic average roughness Ra to be 0.4 µm or less, the ten-point average roughness Rzjis to be 4 µm or less, and the maximum height Rz to be 5 µm or less. By adjusting the chemical polishing time, Ra can be not less than 0.1 µm and not more than 0.4 µm; Rzjis can be not less than 1.5 µm and not more than 4 µm; and Rz can be not less than 1 µm and not more than 5 µm. The chemical polishing may not be performed in the case where the surface roughness recited above is obtained without performing the chemical polishing. It is sufficient to perform the chemical polishing only for the front surface of the copper plate used as the circuit. The locations where the chemical polishing is not performed are masked beforehand.

Then, the process of bonding a semiconductor element, etc., is performed. A bonding layer is provided at the location where the semiconductor element is to be bonded. It is favorable for the bonding layer to be solder or a brazing material. The bonding layer is provided; and the semiconductor element is provided on the bonding layer. A metal terminal is bonded via the bonding layer as necessary. Wire bonding is provided as necessary. The numbers of each of the semiconductor element, the metal terminal, and the wire bonding are appropriately adjusted.

In the ceramic copper circuit board according to the embodiment, the number of grain boundaries of the copper circuit board front surface is controlled. Thereby, excellent reliability can be obtained no matter where the semiconductor element, the metal terminal, and the wire bonding are bonded to the copper circuit board front surface. Therefore, the locations on the copper circuit board front surface where the semiconductor element, etc., are mounted are not limited. The ease of assembly when manufacturing the semiconductor device can be improved.

Position detection that is referenced to the copper circuit board front surface also is easy. Therefore, even in the case where the semiconductor element, the metal terminal, the wire bonding, etc., are multiply provided, the positions do not shift easily. In other words, the ceramic copper circuit board according to the embodiment is favorable in a semiconductor device in which the semiconductor element, the metal terminal, and the wire bonding are multiply provided.

A recognition display to improve the visibility for the positional alignment may be performed. Laser patterning or etching of the copper circuit board front surface, providing a resin layer on the copper circuit board front surface, etc., are examples of recognition display methods. A bar code display may be provided in the case where the resin layer is provided.

EXAMPLE

Examples 1 to 7 and Comparative Examples 1 and 2

First to third silicon nitride substrates shown in Table 1 were prepared as ceramic substrates. The size of each ceramic substrate is 50 mm long×40 mm wide. Two through-holes having diameters of 2 mm are provided in the third silicon nitride substrate.

TABLE 1

|  | THERMAL CONDUCTIVITY (W/m · K) | THREE-POINT BENDING STRENGTH (MPa) | SUBSTRATE THICKNESS T1 (mm) |
| --- | --- | --- | --- |
| FIRST SILICON NITRIDE SUBSTRATE | 90 | 650 | 0.32 |
| SECOND SILICON NITRIDE SUBSTRATE | 85 | 750 | 0.25 |
| THIRD SILICON NITRIDE SUBSTRATE (WITH THROUGH-HOLE) | 90 | 650 | 0.32 |

Then, copper plates were prepared. Two types of thicknesses of the copper plate, i.e., 0.6 mm and 0.8 mm, were prepared. The ceramic substrate and the copper plates were bonded by reactive metal bonding. In the reactive metal brazing material used in the reactive metal bonding, the content of Ti is 2 wt %; the content of In is 10 wt %; the content of Cu is 30 wt %; and the remainder is Ag. Reactive metal paste was coated onto the two surfaces of the ceramic substrate; the copper plates were disposed; and a thermal bonding process was performed. The bonding temperature was maintained in the range of 780 to 850° C.; and the pressure was set to $1 \times 10^{-2}$ Pa or less. The number of grain boundaries in the copper plate front surface was adjusted by changing the bonding time. For the examples, a brazing material paste degreasing process of maintaining the temperature in the range of 250 to 450° C. was performed. When the third silicon nitride substrate was used as the ceramic substrate, the copper plates were bonded after filling a reactive metal brazing material into the through-holes.

The front copper plate was etched into a circuit configuration. The front copper plate had two to four circuit configurations. When the third silicon nitride substrate was used, the back copper plate also was etched into a circuit configuration. The total volume of the copper circuit board (the front copper plate) was taken as A (mm3); and the total volume of the back copper plate was taken as B (mm3).

The ceramic copper circuit boards that were obtained are shown in Table 2.

TABLE 2

|  | CERAMIC SUBSTRATE | COPPER PLATE (THICKNESS T2) | T2/T1 | A/B |
| --- | --- | --- | --- | --- |
| EXAMPLE 1 | FIRST SILICON NITRIDE SUBSTRATE | 0.6 | 1.88 | 0.8 |
| EXAMPLE 2 | SECOND SILICON NITRIDE SUBSTRATE | 0.6 | 2.4 | 0.7 |
| EXAMPLE 3 | THIRD SILICON NITRIDE SUBSTRATE | 0.6 | 1.88 | 0.8 |
| EXAMPLE 4 | FIRST SILICON NITRIDE SUBSTRATE | 0.8 | 1.33 | 0.8 |
| EXAMPLE 5 | SECOND SILICON NITRIDE SUBSTRATE | 0.8 | 2.4 | 0.5 |
| EXAMPLE 6 | FIRST SILICON NITRIDE SUBSTRATE | 1.2 | 3.75 | 0.6 |
| EXAMPLE 7 | SECOND SILICON NITRIDE SUBSTRATE | 1.2 | 4.8 | 0.7 |
| COMPARATIVE EXAMPLE 1 | FIRST SILICON NITRIDE SUBSTRATE | 0.6 | 1.88 | 0.8 |
| COMPARATIVE EXAMPLE 2 | FIRST SILICON NITRIDE SUBSTRATE | 0.6 | 1.88 | 0.8 |

Then, the surface roughness of the examples 1 to 7 was adjusted by performing chemical polishing of the copper circuit board front surface. Chemical polishing was not performed for the comparative example 1 and the comparative example 2. The number of grain boundaries of the copper circuit board front surface and the surface roughness were measured for each ceramic copper circuit board.

An enlarged photograph of the copper plate front surface was taken to count the number of grain boundaries. A 10-mm straight line was drawn randomly in the enlarged photograph; and the number of grain boundaries on the straight line was verified. This operation was performed to measure five locations (five random 10-mm straight lines); and the maximum value and the minimum value are shown. Also, the surface roughness Ra, Rzjis, and Rz were measured based on the JIS-B-0601 (2001) standard. The results are shown in Table 3.

TABLE 3

| | NUMBER OF GRAIN BOUNDARIES PER 10-mm STRAIGHT LINE | SURFACE ROUGHNESS | | | |
|---|---|---|---|---|---|
| | | ARITHMETIC AVERAGE ROUGHNESS Ra (μm) | TEN-POINT AVERAGE ROUGHNESS Rzjis (μm) | MAXIMUM HEIGHT Rz (μm) | ROUGHNESS CURVE SKEWNESS Rsk |
| EXAMPLE 1 | 83~105 | 0.4 | 3.8 | 4.7 | −0.10 |
| EXAMPLE 2 | 22~38 | 0.2 | 2.8 | 3.7 | −0.09 |
| EXAMPLE 3 | 98~116 | 0.3 | 2.2 | 3.0 | −0.07 |
| EXAMPLE 4 | 14~18 | 0.1 | 1.9 | 2.4 | −0.04 |
| EXAMPLE 5 | 55~72 | 0.3 | 2.7 | 2.9 | −0.04 |
| EXAMPLE 6 | 91~132 | 0.1 | 2.5 | 2.9 | −0.01 |
| EXAMPLE 7 | 105~145 | 0.2 | 3.4 | 3.6 | −0.03 |
| COMPARATIVE EXAMPLE 1 | 2~4 | 0.8 | 6.3 | 9.2 | +0.22 |
| COMPARATIVE EXAMPLE 2 | 288~346 | 0.4 | 5.2 | 6.1 | +0.17 |

For the examples, it can be seen from Table 3 that the front surface of the copper circuit board of the ceramic copper circuit board was within the scope of the favorable embodiments. On the other hand, the number of grain boundaries is too small in the comparative example 1. The number of grain boundaries is too high in the comparative example 2.

Then, the warp amount and the diffusion state of Ag were verified for the ceramic copper circuit boards according to the examples and the comparative examples. The measurement of the warp amount was performed by drawing a straight line from one end to the other end of a long side of the silicon nitride substrate and by using the longest distance between the straight line and the silicon nitride substrate as the warp amount.

The measurement of the diffusion state of Ag was performed by measuring any cross section of the copper circuit board by EDX. Color mapping of the dispersion state of Ag inside the copper circuit board was performed. The thickness T2 of the copper circuit board was uniformly trisected and taken as the region 3a, the region 3b, and the region 3c from the side proximal to the bonding layer. A unit area of 100 μm×100 μm was measured for each region; and the proportion (the diffusion area ratio) of Ag per unit area was measured. The diffusion area ratio of Ag was determined by performing this operation 3 times for each region. The results are shown in Table 4.

TABLE 4

| | CERAMIC SUBSTRATE WARP AMOUNT (mm) | Ag DIFFUSION AREA RATIO (%) INSIDE COPPER CIRCUIT BOARD | | |
|---|---|---|---|---|
| | | REGION 3a | REGION 3b | REGION 3c |
| EXAMPLE 1 | 0.01 | 26~56 | 5~22 | 0 |
| EXAMPLE 2 | 0.06 | 18~38 | 2~5 | 0 |
| EXAMPLE 3 | 0.02 | 30~58 | 3~19 | 0 |
| EXAMPLE 4 | 0.05 | 25~42 | 0~3 | 0 |
| EXAMPLE 5 | 0.07 | 17~36 | 0~2 | 0 |
| EXAMPLE 6 | 0.03 | 45~60 | 0~16 | 0 |
| EXAMPLE 7 | 0.04 | 38~58 | 0~15 | 0 |
| COMPARATIVE EXAMPLE 1 | 0.22 | 0~2 | 0 | 0 |
| COMPARATIVE EXAMPLE 2 | 0.09 | 82~90 | 36~55 | 0 |

The warp amount of the ceramic copper circuit board was less than 0.1 mm for the examples. The warp amount was small even though a warp correction process was not performed for any of the examples.

For the ceramic copper circuit boards according to the embodiment, the diffusion area ratio of Ag was not less than 20% and not more than 80% in the region 3a proximal to the bonding layer. The diffusion area ratio of Ag was 20% or less (including 0) in the region 3b which is the region in the middle. The diffusion area ratio of Ag was 0% in the region 3c which is the front-surface-side region.

Conversely, the warp amount was large for the ceramic copper circuit board of the comparative example 1. The diffusion area ratio of Ag was large for the ceramic copper circuit board of the comparative example 2. It can be seen that the number of grain boundaries in the copper plate affects the diffusion state of Ag.

Then, the ease of assembly was evaluated for the ceramic copper circuit boards according to the examples and the comparative examples. The bondability and the alignment performance of the semiconductor element were evaluated as the evaluation of the ease of assembly.

First, the semiconductor element and the metal terminal were bonded using lead-free solder. Further, conduction was realized by providing wire bonding. The semiconductor device was made thereby. Next, the occurrence rate of conduction defects was verified by performing a TCT test as a test of the bondability for the semiconductor device. Two types of TCT (Temperature Cycle Testing) tests were performed. In a first condition, −30° C.×30 minutes→room temperature×10 minutes→125° C.×30 minutes→room temperature×10 minutes was used as one cycle; and the occurrence rate of conduction defects after 2000 cycles was verified. In a second condition, −40° C.×30 minutes→room temperature×10 minutes→75° C.×30 minutes→room temperature×10 minutes was used as one cycle; and the occurrence rate of conduction defects after 2000 cycles was verified.

For the alignment performance, position detection was performed using a CCD camera; and lead-free solder was coated onto the target location of the copper circuit board front surface. At this time, the proportion for which a misalignment of 0.5 mm or more occurred was verified.

The results are shown in Table 5.

TABLE 5

| | CONDUCTION DEFECT RATE (%) AFTER TCT TEST | | ALIGNMENT PERFORMANCE 0.5 mm OR GREATER MISALIGNMENT |
| --- | --- | --- | --- |
| | FIRST CONDITION | SECOND CONDITION | OCCURRENCE RATE (%) |
| EXAMPLE 1 | 0 | 0 | 0 |
| EXAMPLE 2 | 0 | 0 | 0 |
| EXAMPLE 3 | 0 | 0 | 0 |
| EXAMPLE 4 | 0 | 0 | 2 |
| EXAMPLE 5 | 0 | 0 | 0 |
| EXAMPLE 6 | 0 | 0 | 0 |
| EXAMPLE 7 | 0 | 0 | 0 |
| COMPARATIVE EXAMPLE 1 | 0 | 8 | 4 |
| COMPARATIVE EXAMPLE 2 | 0 | 2 | 0 |

It can be seen from the table that conduction defects did not occur for any of the examples or the comparative examples at the first condition (the high-temperature side being 125° C.). Conversely, at the second condition (the high-temperature side being 175° C.), a difference occurred between the occurrence rates of conduction defects. This is because the wettability of the solder and/or the bonding strength was increased by controlling the number of grain boundaries in the copper plate front surface. The alignment performance also improved for the examples. This result shows that the number of grain boundaries in the copper plate front surface affects the position detectability using the CCD camera. Misalignment occurred when the number of grain boundaries was less than 20 per 10-mm straight line as in the example 4. It was found that having the prescribed number of grain boundaries was effective when performing the position detection using the CCD camera.

Conversely, as in the comparative example 1, there were many conduction defects at the second condition when the grain boundaries were few. This is because the distortion amount of the copper plate front surface due to the thermal expansion was large. When the number of grain boundaries is too high as in the comparative example 2, the heat dissipation decreases. When the heat dissipation decreases, it is difficult for the heat to be emitted. The conduction defect rate of the comparative example 2 is higher than those of the examples at the second condition because it is difficult for the heat to be emitted; and thermal stress is generated in the bonding layers between the semiconductor element and the copper circuit board.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A ceramic copper circuit board, comprising:
   a ceramic substrate; and
   a copper circuit board provided at one surface of the ceramic substrate,
   a ratio of a thickness of the copper circuit board to a thickness of the ceramic substrate being 1.25 or more,
   a number of grain boundaries being not less than 5 and not more than 250 along every 10-mm straight line drawn in a front surface of the copper circuit board,
   wherein a warp amount of the ceramic substrate is less than 0.1 mm.

2. The ceramic copper circuit board according to claim 1, wherein the number of grain boundaries is not less than 20 and not more than 150 along every 10-mm straight line drawn in the front surface of the copper circuit board.

3. The ceramic copper circuit board according to claim 1, wherein the number of grain boundaries is not less than 80 and not more than 150 along every 10-mm straight line drawn in the front surface of the copper circuit board.

4. The ceramic copper circuit board according to claim 1, wherein
   an arithmetic average roughness Ra of the front surface of the copper circuit board is 0.4 µm or less,
   a ten-point average roughness Rzjis of the front surface is 4 µm or less, and
   a maximum height Rz of the front surface is 5 µm or less.

5. The ceramic copper circuit board according to claim 1, wherein
   an arithmetic average roughness Ra of the front surface of the copper circuit board is not less than 0.1 µm and not more than 0.4 µm,
   a ten-point average roughness Rzjis of the front surface is not less than 1.5 µm and not more than 4 µm, and
   a maximum height Rz of the front surface is not less than 1 µm and not more than 5 µm.

6. The ceramic copper circuit board according to claim 4, wherein a skewness Rsk of a roughness curve of the front surface of the copper circuit board is less than 0.

7. The ceramic copper circuit board according to claim 1, wherein the ceramic substrate is one of an aluminum oxide substrate, an aluminum nitride substrate, or a silicon nitride substrate.

8. The ceramic copper circuit board according to claim 1, further comprising a bonding layer provided between the ceramic substrate and the copper circuit board,
   the bonding layer including Ag and Ti.

9. The ceramic copper circuit board according to claim 8, wherein when the copper circuit board is uniformly trisected in a thickness direction, a proportion of a surface area where Ag exists in a region of the copper circuit board on the bonding layer side is not less than 20% and not more than 80%.

10. The ceramic copper circuit board according to claim 1, wherein the thickness of the copper circuit board is 0.6 mm or more.

11. The ceramic copper circuit board according to claim 1, further comprising a copper plate provided at another surface of the ceramic substrate,
   a through-hole being provided in the ceramic substrate,
   the copper circuit board and the copper plate conducting via the through-hole.

12. The ceramic copper circuit board according to claim 11, wherein the number of grain boundaries is not less than 5 and not more than 250 along every 10-mm straight line drawn in a front surface of the copper plate.

13. A semiconductor device, comprising:
the ceramic copper circuit board according to claim 1; and
a semiconductor element mounted to the copper circuit board via a bonding layer.

14. The semiconductor device according to claim 13, further comprising wire bonding or a metal terminal bonded to the copper circuit board.

15. The ceramic copper circuit board according to claim 1, wherein
the number of grain boundaries is not less than 20 and not more than 150 along every 10-mm straight line drawn in the front surface of the copper circuit board,
an arithmetic average roughness Ra of the front surface of the copper circuit board is 0.4 μm or less,
a ten-point average roughness Rzjis of the front surface is 4 μm or less, and
a maximum height Rz of the front surface is 5 μm or less.

16. The ceramic copper circuit board according to claim 1, wherein
the number of grain boundaries is not less than 20 and not more than 150 along every 10-mm straight line drawn in the front surface of the copper circuit board,
an arithmetic average roughness Ra of the front surface of the copper circuit board is 0.4 μm or less,
a ten-point average roughness Rzjis of the front surface is 4 μm or less,
a maximum height Rz of the front surface is 5 μm or less, and
the thickness of the copper circuit board is 0.6 mm or more.

17. The ceramic copper circuit board according to claim 1, wherein
the number of grain boundaries is not less than 20 and not more than 150 along every 10-mm straight line drawn in the front surface of the copper circuit board,
an arithmetic average roughness Ra of the front surface of the copper circuit board is 0.4 μm or less,
a ten-point average roughness Rzjis of the front surface is 4 μm or less,
a maximum height Rz of the front surface is 5 μm or less,
the thickness of the copper circuit board is 0.6 mm or more, and
the ceramic substrate is a silicon nitride substrate.

18. The ceramic copper circuit board according to claim 1, further comprising a bonding layer provided between the ceramic substrate and the copper circuit board, the bonding layer including Ag and Ti, wherein
the number of grain boundaries is not less than 20 and not more than 150 along every 10-mm straight line drawn in the front surface of the copper circuit board,
an arithmetic average roughness Ra of the front surface of the copper circuit board is 0.4 μm or less,
a ten-point average roughness Rzjis of the front surface is 4 μm or less,
a maximum height Rz of the front surface is 5 μm or less, and
the thickness of the copper circuit board is 0.6 mm or more.

19. The ceramic copper circuit board according to claim 1, further comprising a bonding layer provided between the ceramic substrate and the copper circuit board, the bonding layer including Ag and Ti, wherein
the number of grain boundaries is not less than 20 and not more than 150 along every 10-mm straight line drawn in the front surface of the copper circuit board,
an arithmetic average roughness Ra of the front surface of the copper circuit board is 0.4 μm or less,
a ten-point average roughness Rzjis of the front surface is 4 μm or less,
a maximum height Rz of the front surface is 5 μm or less,
the thickness of the copper circuit board is 0.6 mm or more, and
the ceramic substrate is a silicon nitride substrate.

* * * * *